United States Patent [19]
Pullen

[11] Patent Number: 6,108,182
[45] Date of Patent: Aug. 22, 2000

[54] OVERCURRENT SENSING CIRCUIT AND SELF ADJUSTING BLANKING

[75] Inventor: Stuart W. Pullen, Raleigh, N.C.

[73] Assignee: Intersil Corporation, Palm Bay, Fla.

[21] Appl. No.: 09/183,453

[22] Filed: Oct. 30, 1998

[51] Int. Cl.$^7$ .............................. H02H 3/14; H02H 3/20
[52] U.S. Cl. .................... 361/89; 361/93.7; 361/91.2; 330/298
[58] Field of Search .................. 361/78, 79, 83, 361/86, 87, 88, 89, 91.1, 91.2, 91.3, 93.1, 93.7, 93.9, 94, 98, 100; 330/251, 298; 381/55, 93, 94.1

[56] References Cited

U.S. PATENT DOCUMENTS

| | | |
|---|---|---|
| 4,600,891 | 7/1986 | Taylor, Jr. et al. . |
| 4,914,542 | 4/1990 | Wagoner . |
| 5,008,586 | 4/1991 | Miyazaki . |
| 5,081,404 | 1/1992 | Kelley et al. . |
| 5,111,123 | 5/1992 | Hach et al. . |
| 5,162,669 | 11/1992 | Hobelsberger . |
| 5,510,753 | 4/1996 | French ..................................... 330/146 |
| 5,642,247 | 6/1997 | Giordano . |
| 5,767,740 | 6/1998 | Fogg ......................................... 330/10 |
| 5,805,020 | 9/1998 | Danz et al. ................................ 330/10 |

FOREIGN PATENT DOCUMENTS

| | | |
|---|---|---|
| 0 399 754 | 11/1990 | European Pat. Off. . |
| 0 402 928 | 12/1990 | European Pat. Off. . |
| 0 688 077 A2 | 12/1995 | European Pat. Off. . |
| 99 12 0865 | 2/2000 | European Pat. Off. . |

OTHER PUBLICATIONS

Izadinia, M., Ueunten, P., Tam, D., Kinzer, D., Wagers, K. "A Next Generation High Performance CMOS/Bipolar/DMOS H–Switch", 1988 Intertec Communication Inc., Reprinted from Motor–Con Oct. 1998 Proceedings.

LMD 18245 3A, 55V DMOS Full–Bridge Motor Driver, Data Sheet, National Semiconductor, Dec. 1993.

*Primary Examiner*—Josie Ballato
*Assistant Examiner*—Kim Huynh
*Attorney, Agent, or Firm*—Jaeckle Fleischmann & Mugel, LLP

[57] ABSTRACT

A sensing circuit 100 includes two resistors 11 and 12, two pnp transistors 13 and 14, and a current mirror 15 and 16. Resistors 11 and 12 convert the high voltages present in the bridge into a proportional current. The current mirror, mosfets 15 and 16, compares $I_1$ and $I_2$. If $I_2$ is greater than $I_1$ the voltage at point A is high. Otherwise this voltage is low. Resistor 12 is chosen smaller than 11 so that under normal operation, when FET 22 turns on, $I_2$ is greater than $I_1$ and the voltage at point A is high. During an overcurrent event, the drop across the FET 22, Von, is so great that $I_2$ is less than $I_1$ and the voltage a point A stays low.

4 Claims, 5 Drawing Sheets

6,108,182

OVERCURRENT SENSING CIRCUIT AND SELF ADJUSTING BLANKING

BACKGROUND

Advances in MOSFET technology as well as advances in integrated circuits have made it possible to apply class D amplifiers to audio applications. A typical Class D amplifier 600 is shown in FIG. 5. The control circuit 660 drives a level shifter 661, which in turn drives upper and lower power fets. The output of the fets is applied to a speaker through a filter, which converts the digital output of the fets into an audio analog signal.

Class D amplifiers are significantly more efficient than class AB amplifiers. The disadvantages are higher part count, cost, electromagnetic interference, and poor performance. With increased integration and the introduction of sophisticated control integrated circuits these disadvantages are becoming less pronounced. In the near future, class D amplifiers will replace class AB amplifiers in many applications. Class D amplifiers already have a clear advantage in high power applications. As the cost and component count of these amplifiers fall, class D amplifiers will be able to complete with class AB amplifiers in low and medium power applications.

To overcome the poor performance of class D amplifiers, others have suggested a self oscillating variable frequency modulator as shown in FIG. 6. An integrator 610 has an audio input over an input resistor $R_{IN}$. It has a digital feedback input A over resistor $R_{DFB}$, and an analog feedback at input B over resistor $R_{AFB}$. The respective analog and digital feedback signals A, B, are taken from the output of the bridge circuit 620 and the low-pass filter that comprises the inductor L and capacitor $C_{LP}$. For purposes of understanding, let us simply focus on the digital output A and assume that there is no audio input. In this case, the output at point A is a square wave with a 50% duty cycle. When the square wave is high, current flows through $R_{DFB}$ into the summing junction of the integrator 610. Its output ramps down until it reaches the negative threshold of the comparator 612. R1 and R2 are used to add hysteresis to the comparator 612. These resistors can be used to adjust the comparator positive and negative thresholds. When the output of the comparator 612 goes low, the upper FET 622 turns off and after a short delay the lower FET 624 turns on. The square wave goes low, and current now flows out of the integrator 610 summing junction through $R_{DFB}$. The output of the integrator 610 reverses and ramps up until it reaches the positive threshold of the comparator 612. This signals the lower FET 24 to turn off. After a short delay the upper FET 622 turns on. The square wave goes high and the cycle continues. With no audio signal, the output at A is a 50% square wave, and the output of the integrator 610 is a triangle wave.

A typical prior art overcurrent scheme is shown in FIG. 7. A sense resistor, 631, is placed in the return path of the speaker. The voltage drop across this resistor is proportional to the speaker current. A low pass filter comprising inductor 632 and capacitor 633 removes switching noise. Two comparators 634, 635 compare the voltage across the sense resistor to two adjustable thresholds (+/− 100 mv in this example). If the voltage across the sense resistor exceeds 100 mv or is less than −100 mv, then the output of OR gate 36 will transition high indicating that an overcurrent event has been detected.

The prior art circuit has a number of drawbacks. It consumes output power and thereby reduces the maximum possible efficiency of the amplifier. The sense resistor can only protect the amplifier from short circuits across the speaker. Shorts from the positive speaker terminal to ground bypass the sense resistor. Thus, no short circuit protection exists in this condition. The prior art circuit is slow and requires a filter to remove the switching noise. The filter introduces undesirable delays. If this circuit is used to implement overcurrent latch off, these delays will likely not cause a problem. If, on the other hand, this detection circuit is used to implement active current limit, these delays will make the current loop difficult to stabilize. The sense resistor is expensive and, if it is undersized, it becomes a reliability risk.

DETAILED DESCRIPTION

Figure 1:
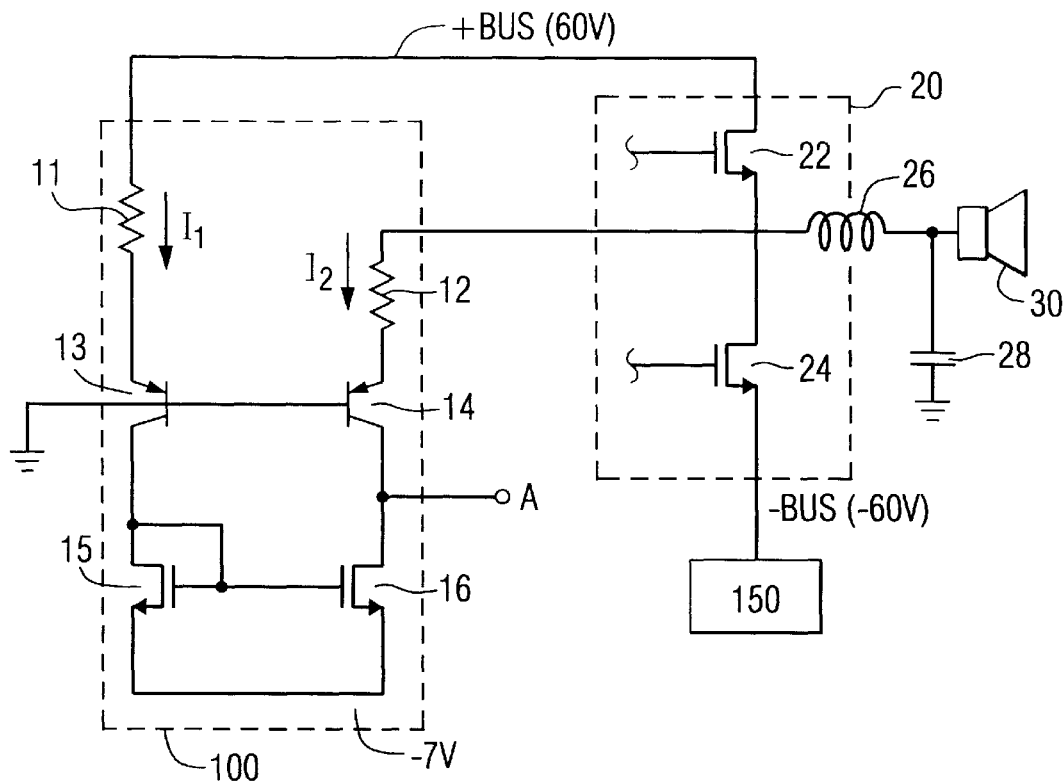
FIG. 1 is a schematic diagram of first and second overcurrent sensing circuits.

A half bridge 20 of a Class D amplifier and sensing circuit 100 are shown in FIG. 1. The half bridge 20 includes two nmos FETS 22, 24. They are connected in series between high voltage bus 40 (+60 volts) and low voltage bus 42 (−60 volts). At the series connection of the two mosfets, their output is coupled to a low pass filter that comprises inductor 26 and capacitor 28. The low pass filter converts the digital output of the bridge 20 to an audio output that drives the load, loudspeaker 30.

A sensing circuit 100 includes two resistors 11 and 12, two pnp transistors 13 and 14, and a current mirror 15 and 16. Resistors 11 and 12 convert the high voltages present in the bridge into a proportional current. For example, $I_1$=(+bus −Vbe)/R11 and when the upper Fet is on, $I_2$=(+bus−Vbe−Von)/R12 where Vbe is the drop across the base emitter junction of the pnp, Von is the drop across the mosfet 22, and R12 and R11 are the resistances of resistors 11 and 12 respectively. The current mirror, mosfets 15 and 16, compares $I_1$ and $I_2$. If $I_2$ is greater than $I_1$ the voltage at point A is high. Otherwise this voltage is low. Resistor 12 is chosen smaller than 11 so that under normal operation, when FET 22 turns on, $I_2$ is greater than $I_1$ and the voltage at point A is high. During an overcurrent event, the drop across the FET 22, Von, is so great that $I_2$ is less than $I_1$ and the voltage a point A stays low.

Thus, the relative values of resistors 11 and 12 set the overcurrent threshold. In the preferred embodiment, resistor 12 is approximately 85% the value of resistor 11 and the rdson of the FET is 180 mohms.

Figure 2:
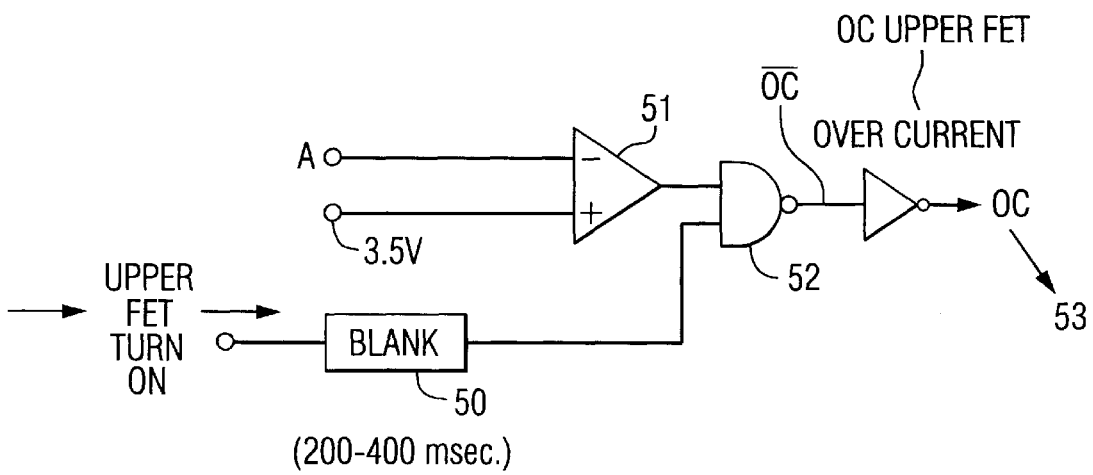
FIG. 2 is a schematic diagram of the blanking circuit for the first overcurrent sensing circuit.

In order for this circuit to function as an overcurrent detector, blanking is required. Under normal operation, point A is only high when FET 22 is on and the current in FET 22 is below the overcurrent threshold. The blanking circuit in FIG. 2 allows FET 22 to turn on and point A to go high before any decision concerning overcurrent is made. The output signal A is compared to a reference voltage of −3.5 volts. When the upper begins to turn on, a 300 ns blanking pulse begins. If A does not go high before the blanking pulse ends then the output of the nand gate 52 will go low and the OC signal will go high. This signals an overcurrent event in FET 22. The bridge can be shut down, or other measures can be taken to reduce the current.

The advantage of this circuit is that the need to bring the high voltage bus on chip is eliminated. Furthermore, both the upper and lower FET can be protected.

Figure 3:
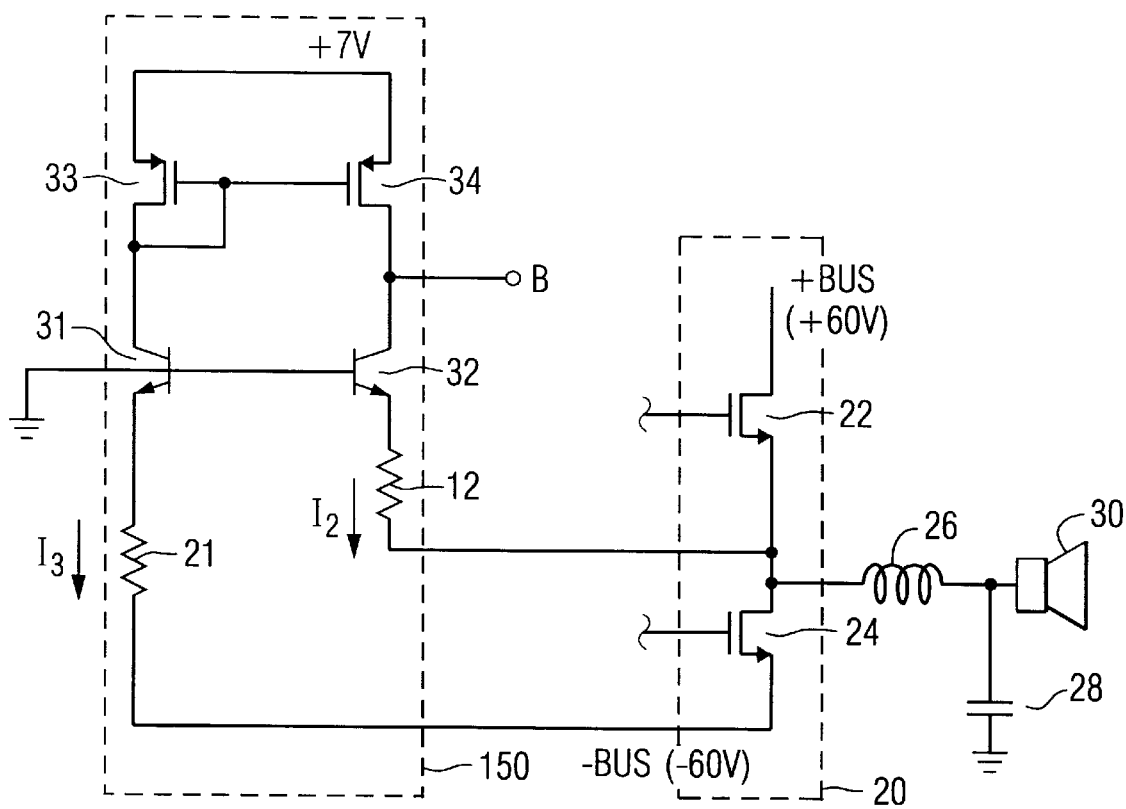
FIG. 3 is a schematic diagram of a second overcurrent sensing circuit for the other fet.
Figure 4:
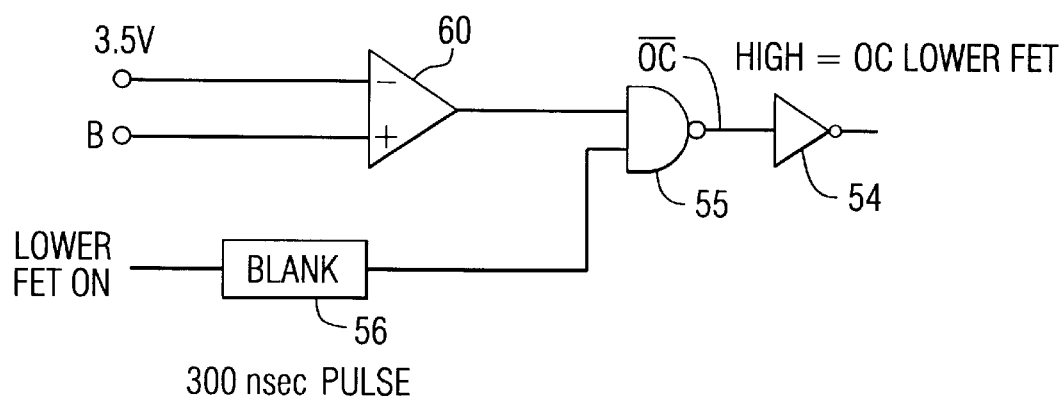
FIG. 4 is a schematic diagram for the second overcurrent sensing circuit.
Figure 5:
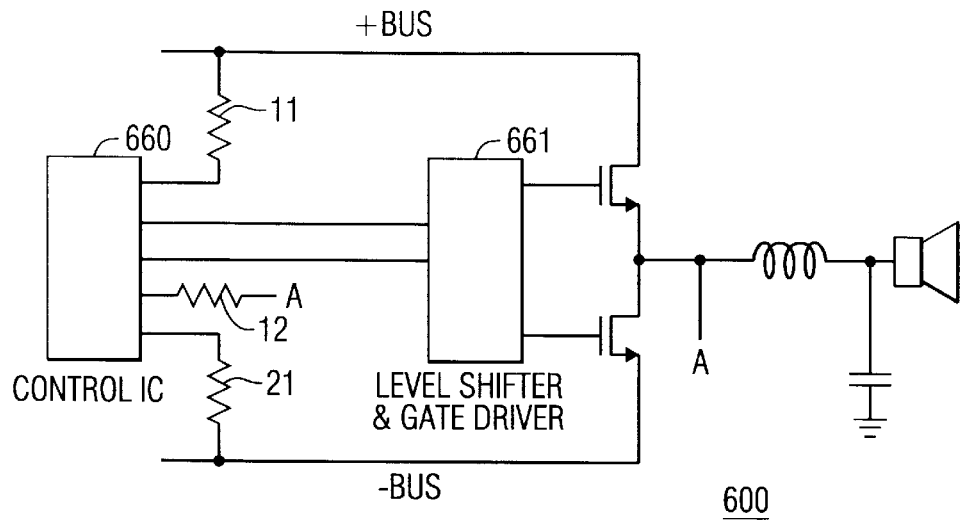
FIG. 5 (prior art) is a schematic diagram of a Class D amplifier.
Figure 6:
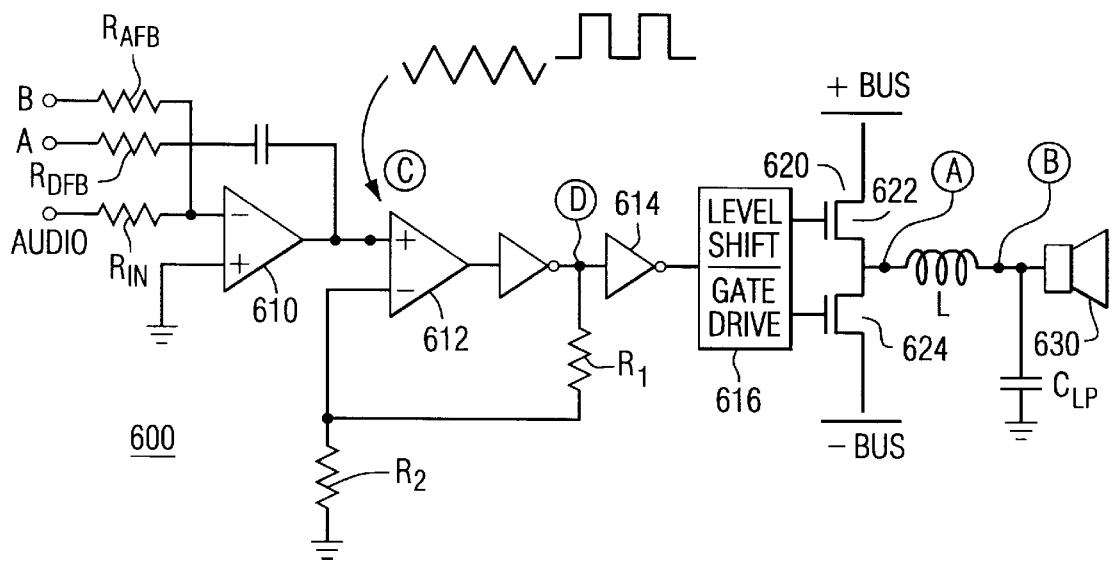
FIG. 6 (prior art) is more detailed schematic diagram of a self-oscillation Class D amplifier.
Figure 7:
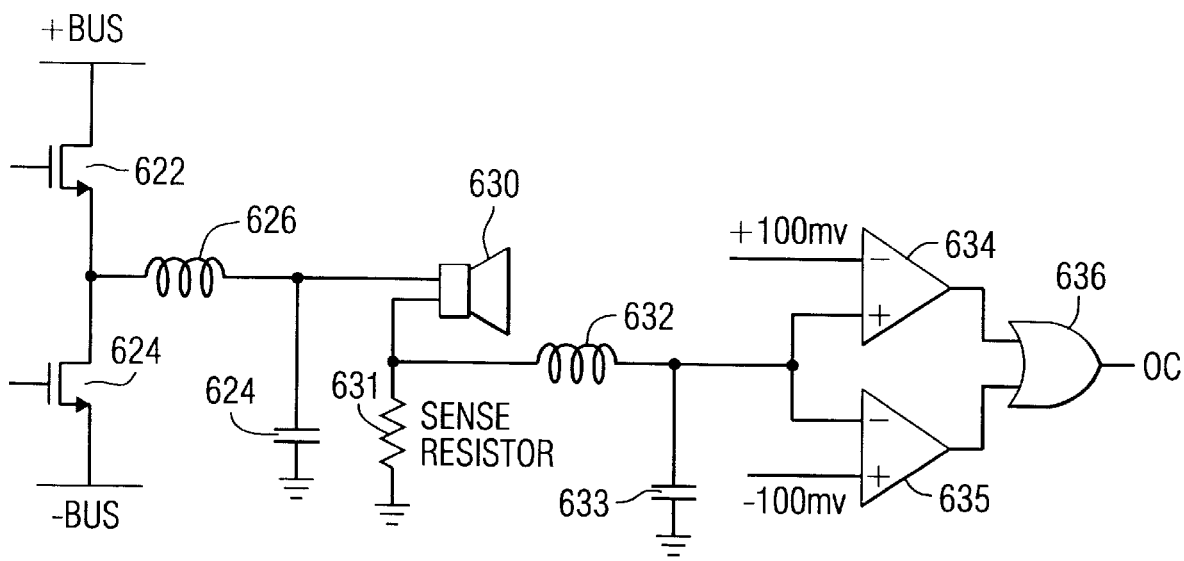
FIG. 7 (prior art) is a partial schematic diagram of a prior art sensing circuit.

FIG. 3 and 4 show a sensing circuit 150 that can be used to sense the current through the FET 24. This circuit operates just like sensing circuit 100. Resistors 21 and 12 convert the high voltage bus and output voltages into proportional currents. The current mirror composed of pmos 33 and 34 and common base npns 31 and 32 compare the magnitude of $I_2$ and $I_3$. Like before the value of resistor 12 is chosen to be 85% of resistor 21. Under normal operation when FET 24 is on, $I_2$ will be greater than $I_3$ and point B will be low. When the current through FET 24 is excessive, the drop across FET 24 will ensure that $I_2$ is less than $I_3$ and point B will stay high. Like circuit 100, a blanking pulse is required to allow FET 24 sufficient time to turn on. The upper and lower FET sensing circuits, 100 and 150, share resistor 12. Thus, only three IC pins are required to implement overcurrent protection for both FET 22 and FET 24.

The new sensing circuit has several advantages over the conventional approach. The invention does not consume output power so the maximum efficiency of the amplifier is not reduced. The sense circuit not only protects the amplifier from short circuits across the speaker but also guards against shorts from the positive speaker terminal to ground. The sensing circuit is faster and does not require a filter to remove the switching noise introduces undesirable delays. The sensing circuit is less expensive than the prior art output power resistor. The new circuit is self-correcting. As the mosfets heat up, their rdson increases. Thus, the overcurrent threshold is lower at high temperatures.

Overcurrent Limit

Figure 8:
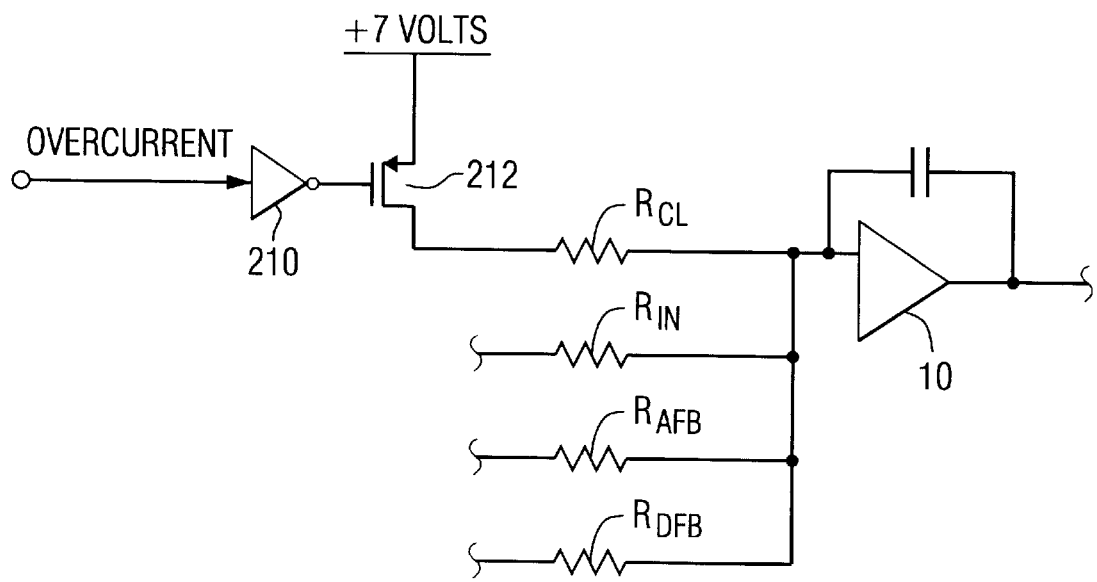
FIG. 8 is a schematic of an overcurrent limit circuit.

As explained in copending application Ser. No. 9/173,111 filed Oct. 15, 1998, injecting or removing current from the integrator modifies the gain of the integrator 10. With reference to FIG. 8, the overcurrent limiting circuit (OCL) 200 relies upon the same principle to prevent or correct an overcurrent event. The overcurrent signal from AND gate 52 is input to an inverter 210 and then applied to the gate of pmos transistor 212. When the overcurrent signal is high, transistor 212 is turned on and it connect a +7 volt supply to an input resistor $R_{CL}$. Injecting current into the summing junction of the integrator 10 reduces the gain of the amplifier and thereby reduces the current in the bridge 20.

The OCL circuit 200 has significant advantages over prior art interruption circuits. First of all, the OCL circuit 200 is very fast. No filtering of the audio power output is required and there is little or no delay. The OCL circuit 200 activates as soon as the monitored MOSFET exceeds it current limit. The OCL circuit 200 is easily stabilized. The delays inherent in a filtered analog feedback loop make such systems almost impossible to stabilize. With the digital approach used by OCL 200, filtering is eliminated and there are no delays. Finally, the adjustment to the output power is gradual and the output undergoes a soft clip. That eliminates the unwanted audio artifacts that a common when an analog interrupt circuit imposes a hard clip on the amplifier.

Short and Low Impedance

The output of transistor 212 remains high as long as there is a sensed overcurrent condition. The overcurrent signal will ultimately reduce the gain of the integrator 10 and thereby control the overcurrent event. However, there are inherent delays in the propagation of a reduced gain to the drive signals that control the power mosfets. In the case of a short circuit across a power mosfet, it is imperative that power to the shorted mosfet be interrupted as quickly as possible. It is also imperative that a short circuit be distinguished from a low impedance condition. It is desired to only interrupt power to the mosfet in a true emergency. A typical emergency occurs when there is a short circuit and when a low load impedance condition persists for a time period long enough to cause permanent damage to the mosfet.

Figure 9:
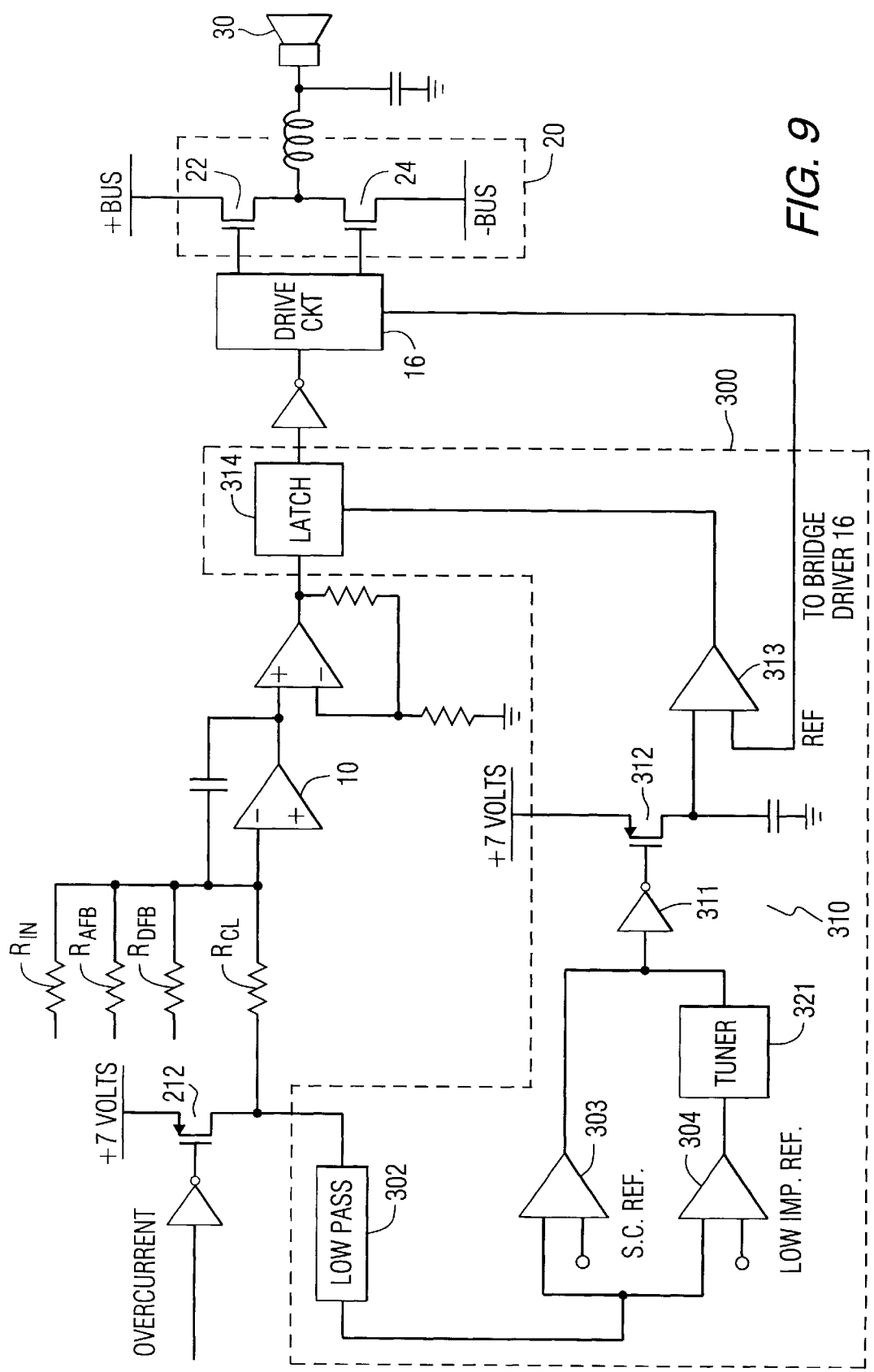
FIG. 9 is a schematic of a short and low impedance protection circuit.

A protection circuit 300 (FIG. 9) senses both the short circuit and the low impedance conditions, distinguishes between them and timely interrupts power to the mosfets by bypassing the integrator and comparator and thereby avoiding their inherent delays. The protection circuit 300 has a low pass filter 302 and first and second comparators 303, 304. The low pass filter 302 is typically a resistor-capacitor network with a time constant chosen to filter out high frequency signals and only pass relatively low frequency, dc-like signals. The input to the low pass filter 302 is a pulse signal that has a duty cycle that is proportional in duration to the load impedance. The filter 302 converts the pulse signal into a signal with amplitude that is proportional to the load impedance. The first comparator 303 detects a short circuit (almost zero load impedance); the second comparator detects a low impedance condition (one to two ohms).

The first comparator 303 has a short circuit reference voltage coupled to one input and the output of the filter 302 coupled to the other input. The output of the first comparator 303 is coupled to a latch circuit 310. The fast latch circuit 310 is located between the gate drive circuit 31 and the power mosfets. It includes an inverter 311, a current source in the form of a nmos fet 312, a comparator 313 and latch 314 that opens the connection between the drive circuit 31 and the mosfets 22, 24. The current path of the fast latch circuit is around the integrator and the comparator so delays inherent in those components will not affect operation of latch 314. When the output of the first comparator is high, the fast latch 314 opens and stays open as long as the comparator 303 is high.

The second comparator 304 has a low impedance reference voltage coupled to one input and the output of the filter 302 coupled to the other input. The output of the comparator 304 is connected to a timer 321 that delays the operation of the latch 314 a short enough time to permit operation at low impedance (one or two ohms) without damage. If the low impedance signal persists beyond the predetermined time of the timer, than the slow latch opens and stays open as long as the comparator 304 is high.

In operation, a short circuit across one of the power mosfets will result in an overcurrent signal on the gate of transistor 212. The output of the transistor 212 is filtered by low pass filter 302 to produce a high amplitude signal output. That output is received by the first comparator 303 and is compared to a short circuit reference voltage. When the input to comparator 303 exceeds the short circuit threshold voltage, the fast latch circuit 310 operates the fast latch 314 to interrupt power to the overcurrent mosfet. When the power falls and the short is cleared, the overcurrent signal falls, the output of the filter 302 drops, the output of the comparator drops and the latch 314 closes to restore the drive signal to the gates of the mosfets.

When there is a low load on the output of the power mosfets, the overcurrent signal is again high. The output of the transistor 212 is filtered by low pass filter 302 to produce a high amplitude signal output. That output is received by the second comparator 304 and is compared to a low impedance reference voltage. When the input to comparator 304 exceeds the low impedance threshold voltage, comparator 304 output triggers timer 321. After timer 321 times out, if the comparator 304 output is still high, the latch 314 opens. When the load increases and the low impedance is cleared, the overcurrent signal falls, the output of the filter 302 drops, the output of the second comparator 304 drops and the latch 314 closes to restore the drive signal to the gates of the mosfets.

With the above disclosure of the invention, those skilled in the art will understand that further modifications, changes, additions and deletions may be made to the disclosed configuration and components without departing from the spirit and scope as defined in the following claims.

What is claimed is:

1. In a class D amplifier a bridge circuit with at least first and second output mosfets, an improved output sensing circuit comprising:

a first conversion circuit for converting the voltage drop across the first output mosfet into a current signal representative of the voltage across the first mosfet, said first conversion circuit having an output signal representative of the current through the first mosfet;

a second conversion circuit for converting the voltage drop across the second output mosfet into a current signal representative of the voltage drop across the second output mosfet, said second conversion circuit having an output signal representative of the current through the second output mosfet;

first and second delay circuits, each coupled to first and second AND circuits, respectively;

first and second comparators for receiving the first and second output signals of the first and second conversion circuits and comparing said first and second output signals to a reference voltage, the output of the first and second comparators coupled respectively to the first and second AND circuits, respectively.

2. The bridge and sensing circuit of claim 1 wherein the delay circuit inhibits the AND circuit from going high for a minimum amount of time corresponding to the turn on time of the output mosfets.

3. The bridge and sensing circuit of claim 1 wherein the first conversion circuit is connected between the series connection of the two mosfets and a first reference voltage and comprises a first resistor in series with a first bipolar transistor and a first low voltage fet, whereby a first output signal at the connection of the first bipolar transistor and the first low voltage fet is in one state when one of the mosfets is on and in the opposite state when the one mosfet is off.

4. The bridge and sensing circuit of claim 1 wherein the second conversion circuit is connected between the series connection of the two mosfets and a second reference voltage and comprises a second resistor in series with a second bipolar transistor and a second low voltage fet, whereby a second output signal at the connection of the second bipolar transistor and the second low voltage fet is in one state when the other of the mosfets is on and in the opposite state when the other mosfet is off.

* * * * *